(12) United States Patent
Hurwitz et al.

(10) Patent No.: US 9,137,905 B2
(45) Date of Patent: Sep. 15, 2015

(54) ALIGNMENT BETWEEN LAYERS OF MULTILAYER ELECTRONIC SUPPORT STRUCTURES

(75) Inventors: Dror Hurwitz, Guangdong (CN); Simon Chan, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 7 days.

(21) Appl. No.: 13/531,948

(22) Filed: Jun. 25, 2012

(65) Prior Publication Data

US 2013/0344628 A1    Dec. 26, 2013

(51) Int. Cl.
*H01L 21/00* (2006.01)
*H05K 3/46* (2006.01)
*H01L 21/48* (2006.01)
*H01L 23/498* (2006.01)

(52) U.S. Cl.
CPC .......... *H05K 3/4679* (2013.01); *H01L 21/4857* (2013.01); *H01L 23/49822* (2013.01); *H01L 2924/0002* (2013.01); *H05K 3/4647* (2013.01); *H05K 2203/025* (2013.01)

(58) Field of Classification Search
CPC .......... H05K 3/4679; H05K 2203/025; H05K 3/4647; H01L 23/49822; H01L 21/4857; H01L 2924/0002

USPC ................................................ 438/11, 14, 16
See application file for complete search history.

(56) References Cited

U.S. PATENT DOCUMENTS

| | | | | |
|---|---|---|---|---|
| 5,898,227 | A * | 4/1999 | Geffken et al. | 257/797 |
| 6,821,687 | B2 * | 11/2004 | Hamanaka et al. | 430/5 |
| 6,979,526 | B2 * | 12/2005 | Ning | 430/314 |
| 7,635,641 | B2 | 12/2009 | Hurwitz et al. | |
| 7,669,320 | B2 | 3/2010 | Hurwitz et al. | |
| 7,682,972 | B2 | 3/2010 | Hurwitz et al. | |
| 7,817,265 | B2 * | 10/2010 | Chou et al. | 356/237.5 |

FOREIGN PATENT DOCUMENTS

| | | |
|---|---|---|
| JP | 06-50851 A | 2/1994 |
| JP | 11-54930 A | 2/1999 |

* cited by examiner

*Primary Examiner* — Laura Menz
(74) *Attorney, Agent, or Firm* — Wiggin and Dana LLP; Gregory S. Rosenblatt

(57) ABSTRACT

A process for alignment a subsequent layer over a previous layer comprising metal features or vias encapsulated in dielectric material comprising the steps of: thinning and planarizing the dielectric material to create a smooth surface of dielectric material and coplanar exposed ends of the via posts; imaging the smooth surface; discerning the position of the end of at least one feature, and using the position of the end of at least one via feature as a registration mark for aligning the subsequent layer.

17 Claims, 6 Drawing Sheets

ALIGNMENT BETWEEN LAYERS OF MULTILAYER ELECTRONIC SUPPORT STRUCTURES

BACKGROUND

1. Field of the Disclosure

The present invention is directed to multilayer interconnect structures.

2. Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough sides walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may create additional stray inductances.

The filling process of the drilled via holes is usually achieved by copper electroplating. The electroplating deposition technique may result in dimpling, where a small crater appears at the top of the via. Alternatively, overfill may result, where a via channel is filled with more copper than it can hold, and a domed upper surface that protrudes over the surrounding material is created. Both dimpling and overfill tend to create difficulties when subsequently stacking vias one on top of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

Although the range of acceptable sizes and reliability is improving over time, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to $60 \times 10^{-6}$ m diameter, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber mat, is laminated thereover and therearound to encase the vias posts. Various techniques and processes can be then use to planarize the dielectric material, removing part of it to expose the tops of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on top of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner and lighter and more powerful products having high reliability. The use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components on top of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or features in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

BRIEF SUMMARY

An aspect of the invention is directed to a process for alignment a subsequent layer over a previous layer comprising metal features encapsulated in dielectric material comprising the steps of:
  a) thinning and planarizing the dielectric material to create a smooth surface of dielectric material and coplanar exposed ends of the metal features;
  f) imaging the smooth surface;
  g) discerning the position of the end of at least one metal feature, and
  h) using the position of the end of at least one metal feature as a registration mark for alignment purposes.

In some embodiments, the metal features are fabricated by electroplating.

In some embodiments, the metal features are vias.

In some embodiments, the at least one metal feature is a via post.

In some embodiments, imaging comprises computerized optical analysis of the image obtained to determine edges of the at least one feature.

In some embodiments, the method further comprises step c) of depositing a seed layer over the smooth surface and step g) of discerning the edges of the at least one metal feature comprises imaging the seed layer.

In some embodiments, the method further comprises step b) of depositing an adhesion/barrier layer over the thinned dielectric layer and prior to depositing the seed layer.

In some embodiments, the method further comprises step d) of laying a photoresist layer over the seed metal.

In some embodiments, the seed layer is characterized by having a thickness of up to 3 microns.

In some embodiments, the seed layer is deposited by physical vapor deposition (PVD) or an electroless deposition process and comprises at least one metal selected from the group comprising Ni, Au, Cu and Pd.

In embodiments, having an adhesion/barrier layer, the adhesion/barrier layer may be characterized by a thickness between 0.04 to 0.2 microns and may be deposited by a physical vapor deposition process (PVD) and comprises at least one metal selected from the group comprising Ti, Ta, W, Ni, Cr, Pt, Al and Cu.

In some embodiments step (a) comprises at least one of the techniques selected from the group comprising mechanical grinding, mechanical polishing and chemical Mechanical Polishing (CMP).

In some embodiments, a plurality of ends of via posts are imaged and a pattern for the subsequent layer is written by a laser, using via posts from the plurality of via posts to make adjustments to correct the position of the laser whilst exposing and developing the pattern.

In some embodiments, the process may be automated by a control computer.

In some embodiments, a plurality of ends of via posts are imaged and the position of the via posts is used to position a photomask.

In some embodiments, alignment of better than +−10 microns is attainable.

In some embodiments, alignment of better than +−3 microns is attainable.

In some embodiments, the at least one feature used for alignment purposes has a cross section that includes at least one straight edge.

In some embodiments, the at least one feature used for alignment purposes has a cross section that includes at least two perpendicular straight edges.

The term microns or µm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that there is no effective upper limit to the in-plane dimensions of a feature.

Figure 1:
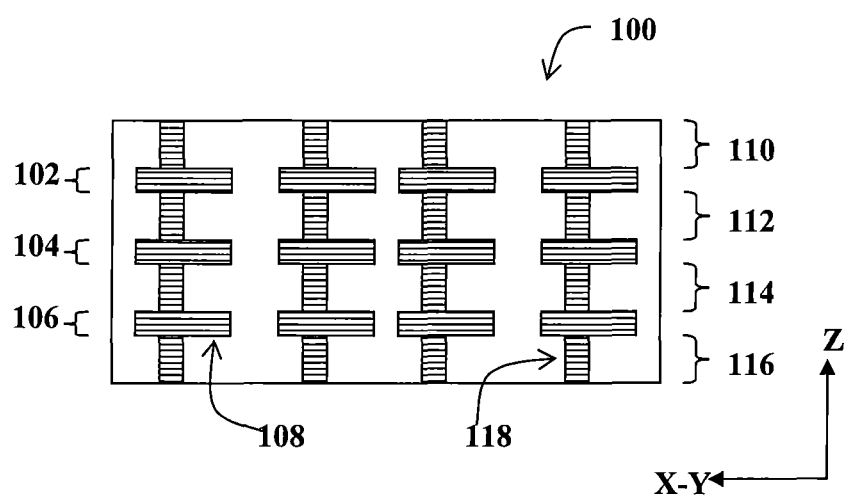
FIG. 1 is a simplified section through a multilayer composite support structure of the prior art.

FIG. 1 is a simplified section through a multilayer composite support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section, as they are fabricated by first drilling a laser hole in the dielectric. Since the dielectric is heterogeneous and anisotropic, and consists of a polymer matrix with inorganic fillers and glass fiber reinforcements, the circular cross-section thereof is typically rough edged and the cross-sections thereof may be slightly distorted from a true circular shape. Furthermore, the vias tend to taper somewhat, being inverse frusto-conical instead of cylindrical.

As described in U.S. Pat. No. 7,682,972, U.S. Pat. No. 7,669,320 and U.S. Pat. No. 7,635,641, for example, the structure of FIG. 1 may alternatively be fabricated by plating in a pattern in a photo-resist (pattern plating), or panel plating and then selectively etching, either way leaving up standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

There is a further disadvantage with laser drilled vias, in that due to positioning limitations, in current state of the art, the position of the via can only be controlled to within 10 microns of where it should be.

Figure 2:
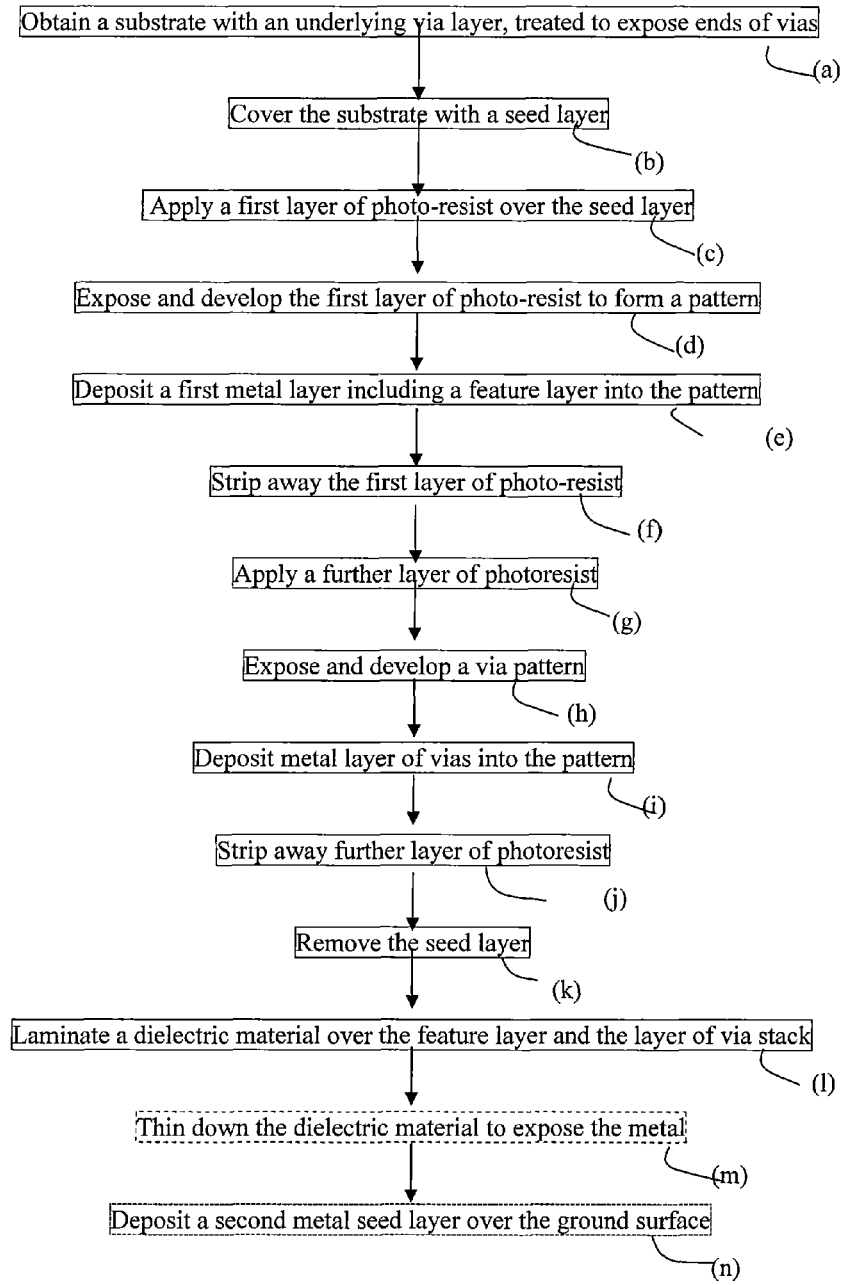
FIG. 2 is one flowchart showing how structures of the invention may be fabricated.

Referring to FIG. 2, in some embodiments, each double layer comprising a feature or pad layer and a via layer thereover may be fabricated by the steps of: obtaining a substrate including an underlying via layer that is treated to expose the copper thereof—step (a), and covering the substrate with a seed layer, typically copper—step (b). A first, thin layer of photoresist is applied over the seed layer—step (c), and the first, thin layer of photoresist is exposed and developed to form a negative pattern of features—step (d). A metal, typically copper, is deposited into the negative pattern of features—step (e), and the first thin layer of photoresist is stripped away—step (f) leaving the layer of features upstanding. A second, thicker layer of photoresist is now applied—step (g) and a second negative pattern of via posts is exposed and developed therein—step (h). A layer of metal, typically copper, is deposited in the trenches developed in the second pattern—step (i) to fabricate a via layer that includes via posts of different dimensions. The second layer of photoresist is stripped away—step (j) leaving the layer of via posts including at least two via posts of different dimensions, and the feature layer upstanding. The exposed seed layer is now removed—step (k). This may be accomplished by exposing the structure to a wet etch of ammonium hydroxide or copper chloride, for example. A dielectric material is then laminated over the via layer including via posts of different dimensions—step (l). The dielectric material is generally a composite material comprising a polymer matrix, such as polyimide, epoxy, Bismaleimide, Triazine and blends thereof, and may further comprise ceramic or glass. Typically the dielectric is provided as a prepreg consisting of woven glass fiber bundles in a polymer resin pre-preg with ceramic fillers.

To enable further build up of additional layers, the dielectric material may be thinned to expose the metal—step (m). The thinning may be accomplished using mechanical grinding or polishing, chemical polishing, or chemical mechanical polishing CMP. The thinning also planarizes the structure. Then a metal seed layer, such as copper, may be deposited over the thinned surface—step (n), to enable further layers to be built up. The seed layer is typically 0.5 microns—to 1.5 microns. To aid its adhesion, a adhesion/barrier layer of titanium, tantalum, chromium, tungsten or mixtures thereof, typically being 0.04 to 0.1 microns thick, may be first deposited. The seed layer may be deposited using sputtering or electroless plating, for example.

Various variant fabrication routes, such as panel plating instead of pattern plating are known. For example, referring to FIG. 3, in a variant fabrication route, the at least one via layer is fabricated by the steps of: obtaining a substrate including an underlying feature layer with expose copper—step (i), and covering the underlying feature layer with a seed layer—step (ii) which is typically copper and is typically deposited by sputtering or by electroless plating. A metal layer is deposited over the seed layer—step (iii). This metal layer is typically copper, and may be deposited by electroplating. A layer of photoresist is laid down over the metal layer—step (iv), and a positive pattern of via posts is exposed and developed therein—step (v). The metal layer exposed is etched away—step (vi). The etching away of copper may be performed using a copper etchant, such as ammonium hydroxide or copper chloride, for example. The photoresist is then stripped away—step (vii), leaving the via posts upstanding, and a dielectric material is laminated over the via posts—step (viii). To enable further build up, the dielectric layer may be thinned—step (ix) to expose the metal, using chemical or mechanical polishing or grinding, or chemical mechanical polishing, for example. The thinning planarizes the layer. Then a further copper seed layer may be deposited over the thinned surface—step (x).

The dielectric material is generally a composite material comprising a polymer matrix, such as polyimide, epoxy, Bismaleimide, Triazine and blends thereof, and may further comprise ceramic or glass. Typically the dielectric is provided as a prepreg consisting of woven glass fiber bundles in a polymer resin pre-preg with ceramic fillers.

The above description is provided by way of explanation only. Multilayer structures such as that of FIG. 1 may be built up by the process of FIG. 2 or FIG. 3 and variations thereof. It will be appreciated that the process is capable of many variations.

It will be appreciated that it is generally important to carefully align each layer with respect to the layer below to ensure that components are correctly positioned. This is true in the drill & fill technology where holes are required to penetrate each layer in the correct position, and is also true in Amitec's plated via post technology, where each layer of via posts and each layer of pads/features needs to be correctly aligned.

Figure 4:
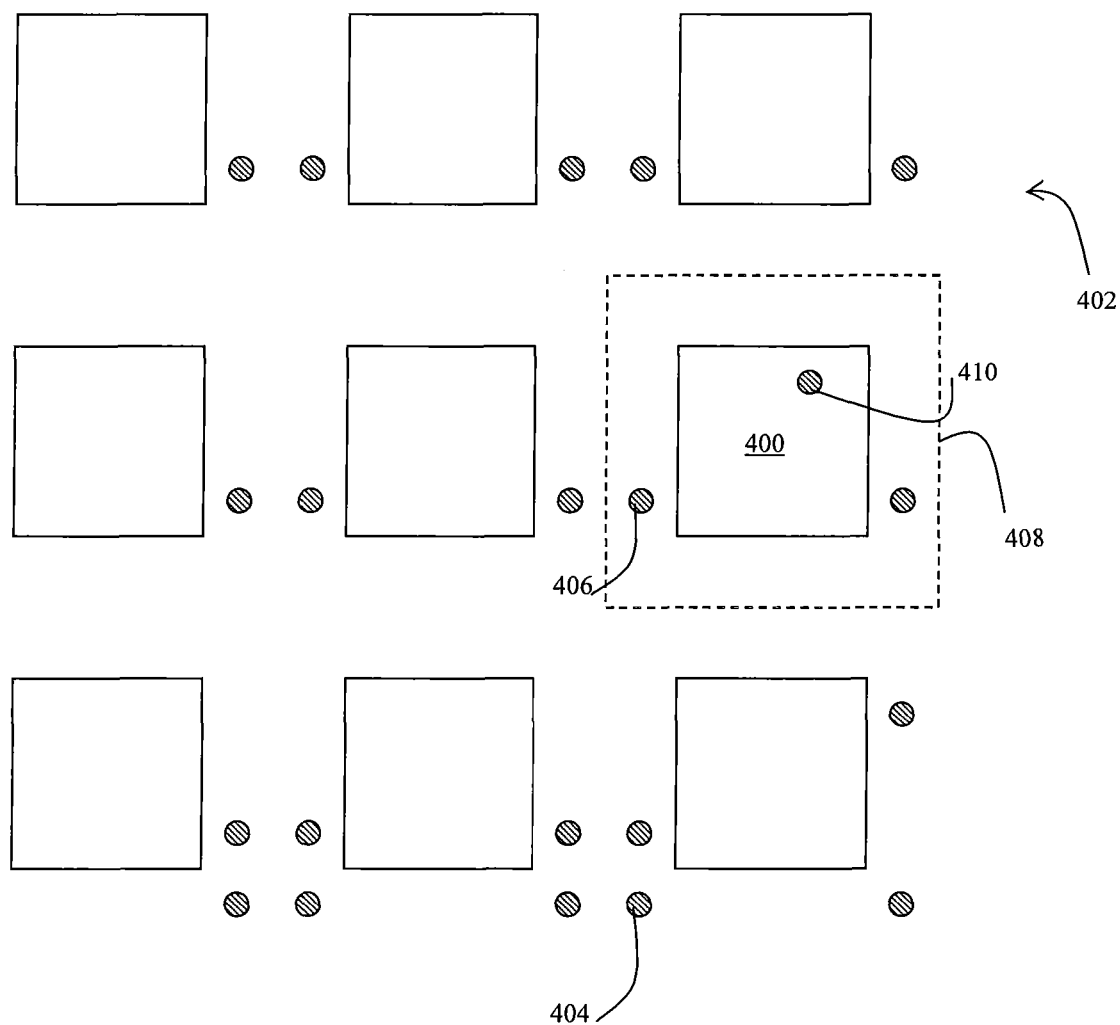
FIG. 4 is a schematic illustration of an array of substrates showing where registration holes may be fabricated.

As shown in FIG. 4, a multilayer electronic support structure 400 is generally fabricated as part of an array 402 of similar multilayer electronic support structures 400 which are then separated. Alignment between one layer of via posts and the next within the multilayer structure is generally achieved by using one or more registration marks 404 in the edges of the array 402, and perhaps by using a registration mark 406 in a margin of an individual support structure 400.

The support structure 400 is flexible, particularly so when consisting of only a few layers and if coreless. The manufacturing process typically includes hot-pressing to cure the dielectric prepreg, and the various metal deposition processes, such as sputtering and electroplating, take place at different temperatures and the structure thus undergoes thermal cycling during fabrication and consequently undergoes expansion and contraction, and perhaps some degree of bending, curling and warping during the manufacturing process, even if the resulting structure is flat. The thinning process used to expose ends of via posts may use mechanical polishing which may generate heat by friction and applies mechanical stresses to the substrate.

In consequence of the above, it is difficult to ensure that individual components within a substrate are within say 10 microns of where they should be, and simply using one or two registration marks 404 along the edges of the array 402 or even registration marks in margins each substrate 400 within the array 402 may prove unsatisfactory because the components to be aligned may not be exactly where they should be.

With reference to FIG. 2 after step (i) the ends of the via posts are exposed but are flush with the surrounding dielectric material. A similar structure is obtained after step (ix) of FIG. 3.

It has been surprisingly found that despite thinning the underlying layer to under a micron and the all over seed layer being deposited thereover that is over 1.5 microns thick, and despite it generally being considered impossible to optically resolve height variations of less than 3 microns, it is nevertheless possible to identify the position of the via posts with great accuracy.

Figure 5:
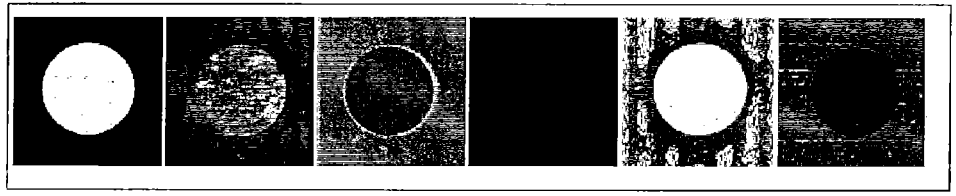
FIG. 5 is a series of optical micrographs with different image analyses procedures applied. The images show the end of a via post in the surface of a layer of an electronic support structure in the X-Y plane that has been thinned and planarized and despite being covered with a 3 micron seed layer of copper, the position of the copper via post may be clearly determined.

With reference to FIG. 5, a series of optical micro-photographs of via posts in the thinned surface of a layer of a multilayer support structure that has been coated with a 2-3 micron thick seed layer of copper are shown. The via posts are 1 mm in diameter. Despite having been thinned so the via posts are flush with the surface, and despite the subsequent all over seed layer of copper, the ends of the copper via posts are, nevertheless, clearly discernable.

Thus it has surprisingly been found possible to use via posts in the previously deposited layer as registration marks for accurately aligning a subsequent layer thereover, despite first depositing an all over seed layer of 0.5 to 3 microns.

It will be appreciated that using the ends of via posts themselves as registration marks enables a high level of alignment of subsequent processes with the via posts. Alignment of +−3 microns is possible.

Referring back to FIG. 4, it is proposed to use one or more via post 410 within the array of via posts in a polished surface of a multilayer support structure 400 for registration purposes for aligning further layers thereover.

Figure 3:
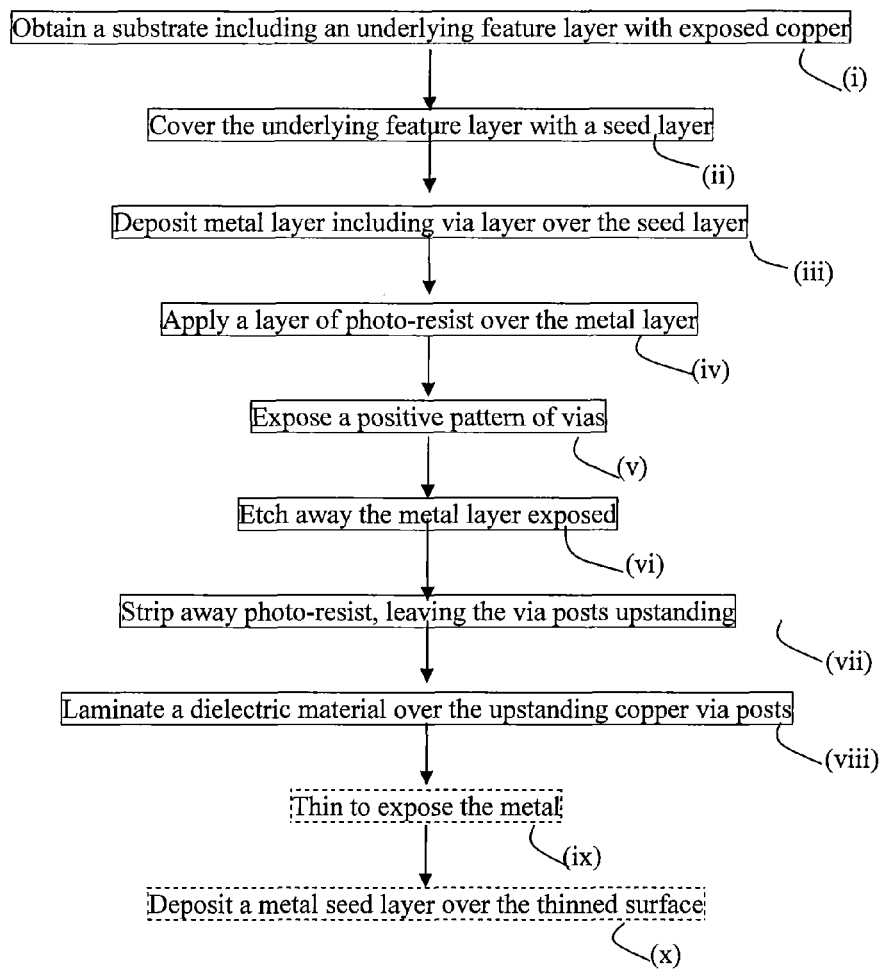
FIG. 3 is another flowchart illustrating a variant process for fabricating a via post layer.

In step (j) of FIG. 2 and step (x) of FIG. 3, the smooth surface with flush via posts are coated with a seed layer. Due to the application of an all over seed layer, the entire surface, including registration marks relating to the position of the via posts are obscured. Registration holes in the margins of the array or in the margins of each support structure may be used for alignment purposes, but the dimensions of such holes is often relatively large, and, if the holes are drilled subsequent to lay up of the structure, the alignment of such holes with the already deposited via posts and features is difficult to achieve, and so using such holes as registration marks for fabricating further layers by the subsequent deposition of additional components is increasingly unsatisfactory due to the alignment errors being additive.

Figure 6:
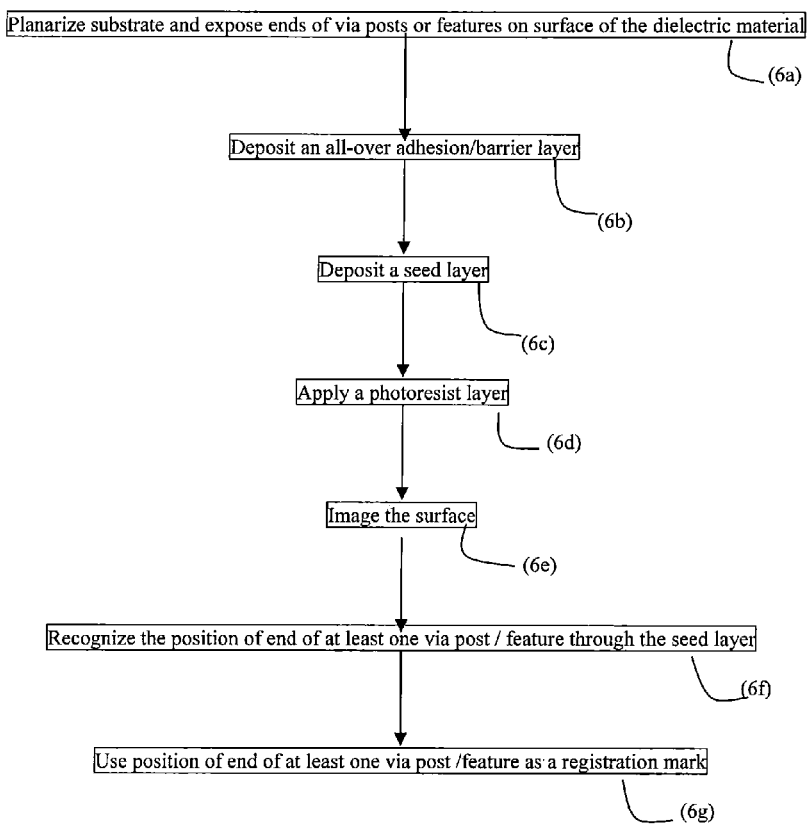
FIG. 6 is a flowchart showing one method by which further layers may be aligned.

With reference to FIG. 6, a method of optically aligning features of a subsequent layer with via posts of a previous layer is now described:

Firstly, the substrate with an upper layer of via posts laminated with dielectric material of the previous layer is thinned and planarized to create a smooth surface of dielectric material with the ends of the via posts exposed—step (6a). A thin adhesion/barrier metal layer may be deposited thereover by a PVD process—step (6b), and a seed layer may be deposited over the smooth surface—step (6c). A layer of photoresist may be deposited over the seed layer—step (6d), and the surface of the photoresist may be imaged—step (6e). Despite the all over adhesion metal and seed layers, the position of the end of at least one via post may be determined—step (6f), and the position of the end of at least one via post may be used as a registration mark for aligning the features of the subsequent layer—step (6g).

Where a mask is used to expose and develop a layer of photoresist laid over the array of substrates, the position of the mask may be aligned by using a number of via posts around the edge of the array as registration marks.

In litho direct write technology a laser is used to expose and develop the photoresist, after laying down the photoresist, the ends of the via posts in the previous layer may be used for direct registration, by controlling the position of a laser used to develop the photoresist by writing. With this technology a number of via posts in the previous layer may be used to adjust the position of the laser on the fly to adjust for post position in consequence of the fabrication process.

Using the via posts for alignment purposes in this manner, alignment of better than +−10 microns and even better than +−3 microns is attainable.

The via posts themselves may be carefully positioned with regard to underlying layers, since photo-masks technology is relatively accurate. Furthermore, a single photo-mask enables all via posts to be fabricated at once and the position of all via posts in a layer are accurately located once the location of two via posts (preferably far apart) is determined. In contradistinction, drill & fill vias are individually fabricated and the position of each drill & fill via may vary by up to 10 microns from the desired location since it is much more difficult to correctly position the drilling laser. Mechanical drilling is even less accurate. Thus the position of a drill & fill via with respect to other drill and fill vias in the same layer and to features in the underlying layer cannot be determined accurately, and so drill & fill vias cannot be used for positioning with the same degree of accuracy as the position of via posts can.

Figure 7:
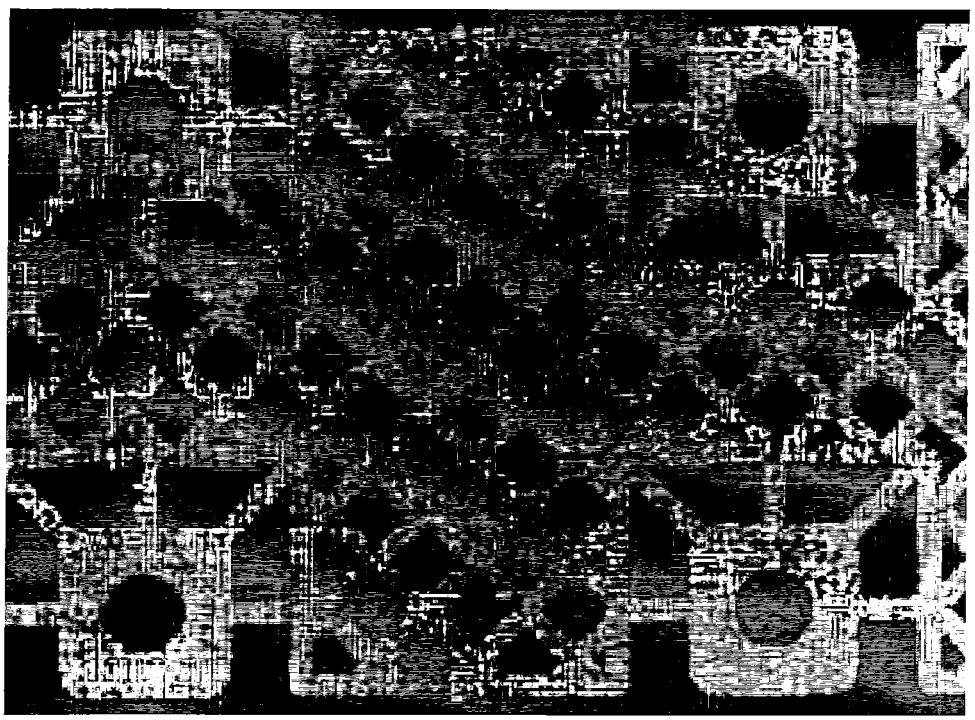
FIG. 7 is a photomicrograph of a copper structure embedded in a dielectric material that has been subsequently polished smooth to expose the copper structure, and then coated with an adhesion metal layer, a seed layer.

As shown in FIG. 7, with appropriate optical imaging techniques (in this case, the CCD cameras of a Laser Direct image system from Orbotech™), it is possible to clearly discern a copper structure (light) embedded in a dielectric matrix (dark) after (a) thinning to flatten, (b) depositing an all over adhesion/barrier layer of titanium that is 0.05 to 0.15 micron thick, (c) depositing a seed layer of copper over the titanium layer that is 0.5 to 1.5 micron thick, and then (d) applying a layer of photoresist that may be 5 to 125 microns thereover (in this case 20 microns). This enables the copper structure of an underlying layer to be used directly for registration purposes through the adhesive, seed and dielectric layers, whether for controlling the position of a laser writing implement for direct development of the photoresist, or for positioning of a photomask. Hereinabove, using round via posts have been described for registration purposes. In FIG. 7, a circular dielectric filled area that is 800 microns in diameter within a square copper structure is shown. This dark circular dielectric structure within a light copper surround may serve for registration just as well as a round via post. The contrast between the copper and the dielectric is optically resolvable despite the thinning, the all-over adhesion layer, the seed layer and photoresist.

Furthermore, it will be appreciated that drill and fill vias are invariably round and cannot be closely aligned. In contradistinction, via posts created by electroplating into photoresist may be closely positioned and may have other shapes. To improve alignment, it is often preferable to provide registration marks that are directional and have straight edges. Preferably a pair of perpendicular straight edges are provided. By electroplating, such registration marks may be fabricated as square posts, cross shapes or an array of rectangular blocks, for example.

In general a target feature for registration purposes may be 50 micron to several millimeters in size, depending on the image acquisition system of the lithography exposure tool.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A process for aligning an upper layer comprising upper metal features over a lower layer of a substrate comprising a dielectric material with a plurality of via posts extending therethrough, comprising the steps of:
   a) thinning and planarizing the dielectric material and an upper end of each via post to create a smooth surface comprising the dielectric material and coplanar exposed upper end of each via post;
   b) imaging the smooth surface;
   c) discerning the position of the upper end of one of the plurality of via posts, and
   d) using the position of the upper end of one of the plurality of via posts as a registration mark for said aligning said upper layer over said lower layer.

2. The process of claim 1, wherein the lower layer via posts and upper layer metal features are fabricated by electroplating into photoresist.

3. The process of claim 1 wherein said imaging comprises computerized optical analysis of the image obtained to determine edges of the upper end of the at least one via post.

4. The process of claim 1 further comprising step a1) of depositing a seed layer over the smooth surface such that step c) of discerning the position of the upper end of one of the plurality of via posts comprises discerning the position of the upper end of one of the plurality of via posts through the seed layer.

5. The process of claim 1 further comprising step a1) of depositing an adhesion/barrier layer over the thinned dielectric layer and then depositing a seed layer such that step c) of discerning the position of the upper end of one of the plurality of via posts comprises discerning the position of the upper end of one of the plurality of via posts through the seed layer and the photoresist layer.

6. The process of claim 1 further comprising step a1) of depositing an adhesion/barrier layer over the thinned dielectric layer and then depositing a seed layer followed by laying a photoresist layer over the seed layer such that step c) of discerning the position of the upper end of one of the plurality of via posts comprises discerning the position of the upper end of one of the plurality of via posts through the adhesion/barrier layer, the seed layer and the photoresist layer.

7. The process of claim 4 wherein the seed layer is characterized by having a thickness of up to 3 microns.

8. The process of claim 4 wherein the seed layer is deposited by physical vapor deposition (PVD) or an electroless deposition process and comprises at least one metal selected from the group comprising Ni, Au, Cu and Pd.

9. The process of claim 5, wherein the adhesion/barrier layer is characterized by a thickness between 0.04 to 0.2 microns and is deposited by a physical vapor deposition process (PVD) and comprises at least one metal selected from the group comprising Ti, Ta, W, Ni, Cr, Pt, Al and Cu.

10. The process of claim 1 wherein step a) comprises at least one of the techniques selected from the group comprising mechanical grinding, mechanical polishing and chemical Mechanical Polishing (CMP).

11. The process of claim 1 wherein a plurality of upper ends of via posts are imaged and a pattern for the upper layer is written by a laser, using upper ends of via posts from the plurality of via posts to make adjustments to correct the position of the laser whilst exposing and developing the pattern.

12. The process of claim 11 being automated by a control computer.

13. The process of claim 1 wherein a plurality of upper ends of via posts are imaged and the position of the plurality of upper ends of via posts are used to position a photomask.

14. The process of claim 1 wherein alignment of better than +−10 microns is attainable.

15. The process of claim 1 wherein alignment of better than +−3 microns is attainable.

16. The process of claim 1, wherein at least one upper end of a via post used to align said upper layer over said lower layer has a cross section that includes at least one straight edge.

17. The process of claim 1, wherein at least one upper end of a via post used to align said upper layer over said lower layer has a cross section that includes at least two perpendicular straight edges.

* * * * *